United States Patent [19]

Ishigaki

[11] 4,430,754

[45] Feb. 7, 1984

[54] NOISE REDUCING APPARATUS

[75] Inventor: Yukinobu Ishigaki, Machida, Japan

[73] Assignee: Victor Company of Japan, Ltd., Yokohama, Japan

[21] Appl. No.: 297,106

[22] Filed: Aug. 28, 1981

[30] Foreign Application Priority Data

Aug. 29, 1980 [JP] Japan ................................ 55-119078

[51] Int. Cl.³ .............................................. H04B 1/64
[52] U.S. Cl. ...................................... 455/72; 333/14; 381/94; 381/107
[58] Field of Search ....................... 455/43, 50, 63, 66, 455/70-72; 369/174, 175; 360/24, 25, 65; 333/14; 179/1 P, 1 D, 1 VL; 330/294, 101, 132, 96, 109, 281, 103; 370/7; 328/170

[56] References Cited

U.S. PATENT DOCUMENTS

| 3,305,627 | 2/1967 | Krause ............................ | 455/43 X |
| 4,187,477 | 2/1980 | Enooh et al. ..................... | 455/72 X |
| 4,363,006 | 12/1982 | Ishigaki et al. ..................... | 333/14 |
| 4,363,007 | 12/1982 | Haramoto et al. ................... | 333/14 |

FOREIGN PATENT DOCUMENTS

| 1120541 | of 0000 | United Kingdom . |
| 1305622 | of 0000 | United Kingdom . |
| 1367002 | of 0000 | United Kingdom . |
| 1500192 | of 0000 | United Kingdom . |
| 1514242 | of 0000 | United Kingdom . |
| 1589162 | of 0000 | United Kingdom . |
| 2032230A | of 0000 | United Kingdom . |
| 2050773A | of 0000 | United Kingdom . |

Primary Examiner—Robert L. Griffin
Assistant Examiner—Albert W. Watkins
Attorney, Agent, or Firm—Louis Bernat

[57] ABSTRACT

A noise reducing apparatus comprises a first variable gain control circuit for giving a level compression characteristic to an input signal by a first composite control voltage, to produce an output signal to a transmission path, a first control voltage producing circuit for dividing an output signal of the first variable gain control circuit into a plurality of frequency bands, and producing a plurality of control voltages respectively given with mutually different integration time constants for each of the divided frequency bands, a first adding circuit for respectively additionally composing the plurality of control voltages obtained from the first control voltage producing circuit, to obtain the first composite control voltage, a second variable gain control circuit for giving a level expansion characteristic complementary to the level compression characteristic to a level compressed signal obtained through the transmission path by a second composite control voltage, to produce an output signal, a second control voltage producing circuit for dividing an input signal of the second variable gain control circuit into a plurality of frequency bands, and producing a plurality of control voltages respectively given with mutually different integration time constants for each of the divided frequency bands, and a second adding circuit for respectively additionally composing the plurality of control voltages obtained from the second control voltage producing circuit, to obtain the second composite control voltage.

7 Claims, 15 Drawing Figures

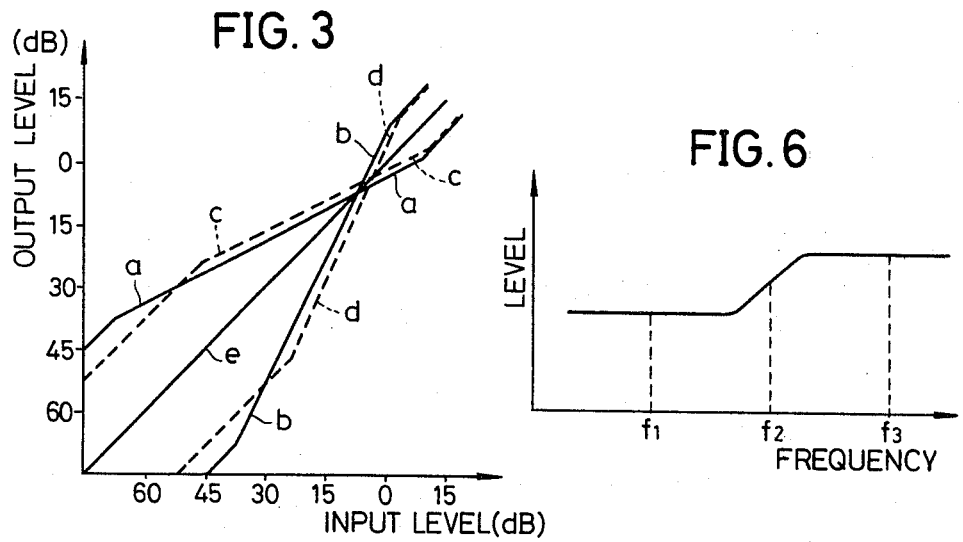
FIG. 3
FIG. 6
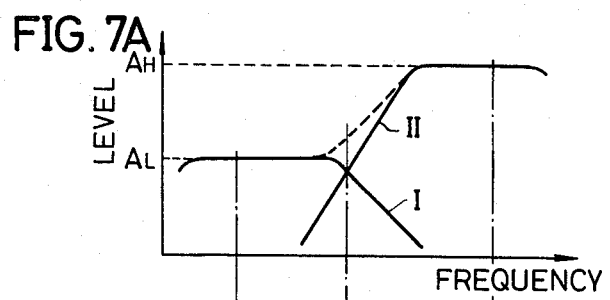
FIG. 7A
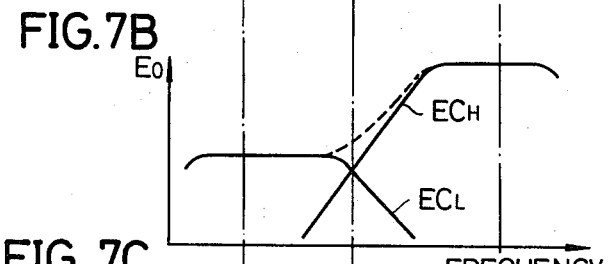
FIG. 7B
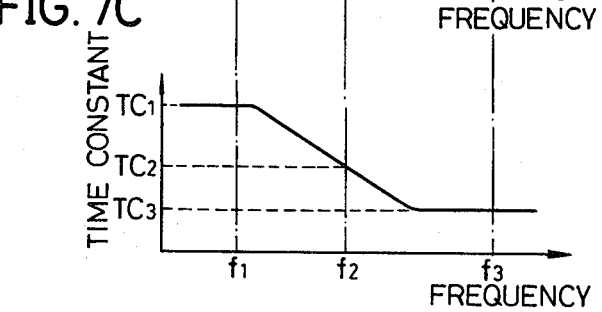
FIG. 7C

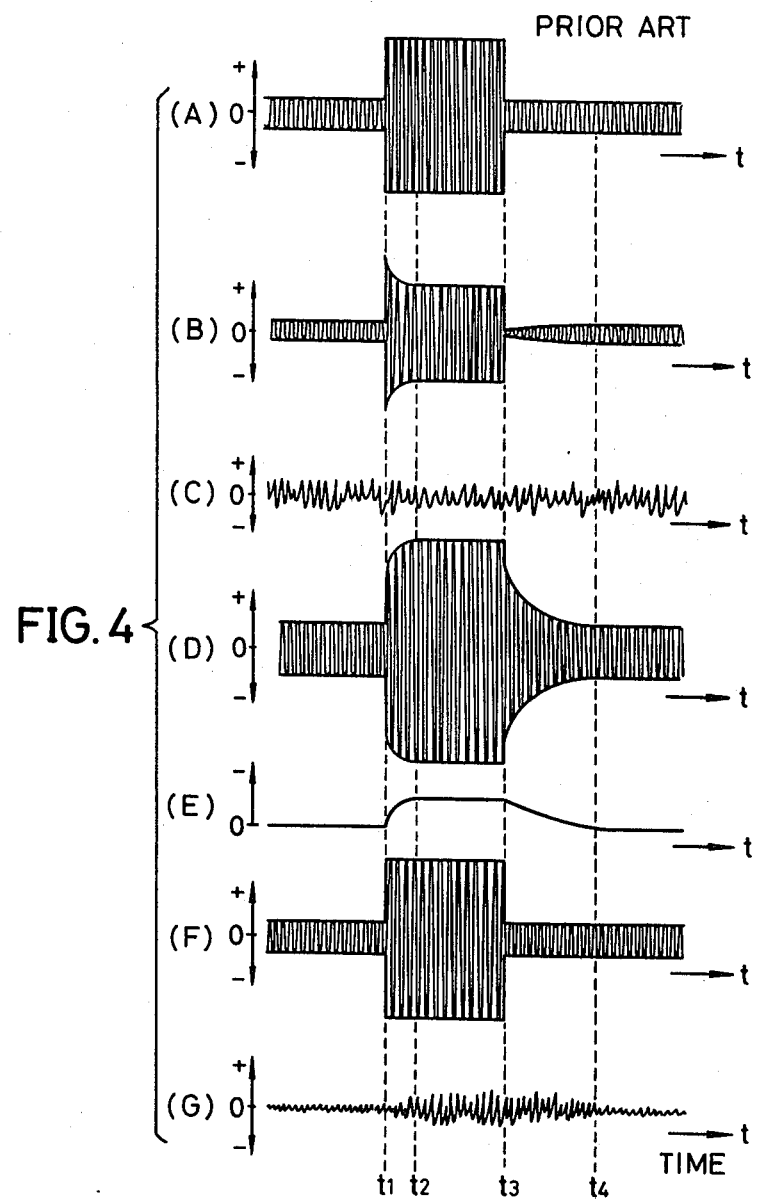

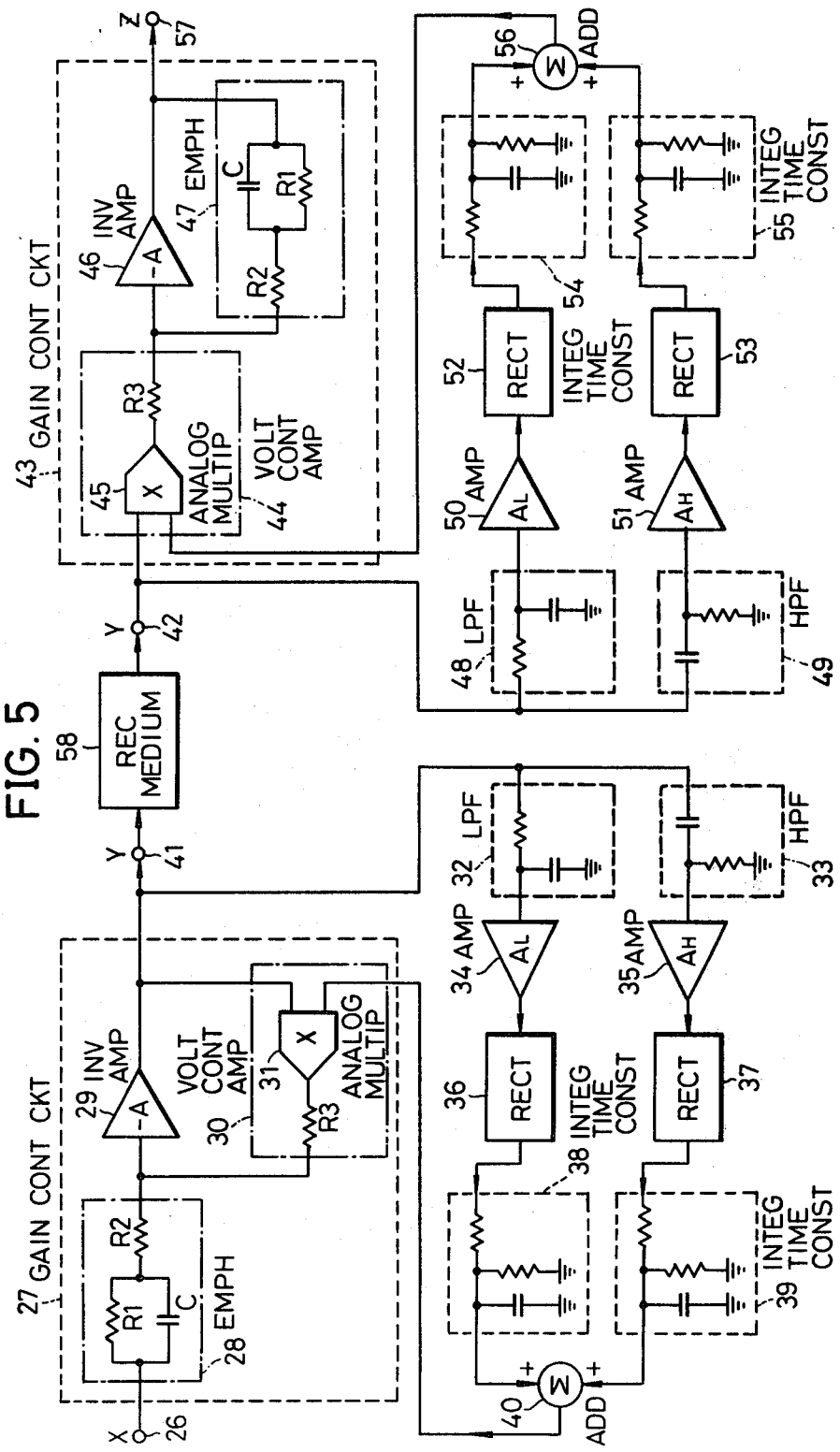

NOISE REDUCING APPARATUS

BACKGROUND OF THE INVENTION

The present invention generally relates to noise reducing apparatuses for reducing noise by compression and expansion of signal levels, and more particularly to a noise reducing apparatus capable of improving noise modulation phenomenon introduced as a secondary effect.

Conventionally, noise reducing apparatuses have been known which perform compression of the signal level and expansion of the signal level complementary to the signal level compression, in order to reduce noise (hiss noise and the like) introduced upon reproduction of a magnetic recording medium in a magnetic recording and/or reproducing system. These known noise reducing apparatuses were used for reducing noise (surface noise and the like) introduced upon tracing of a record disc during reproduction in a recording and reproducing system for the record disc, and further used for improving the degradation introduced in the ratio between receiving signal level and receiving noise level (signal-to-noise ratio) upon long-distance signal reception and the like in the field of signal transmission and reception of radio broadcasting.

In the above conventional noise reducing apparatus, a level compression circuit compresses the signal level of a signal which is to be transmitted, and a level expansion circuit expands the signal level of an incoming level compressed signal obtained through a transmission path by a quantity corresponding to the level compressed quantity of the incoming level compressed signal. Moreover, control voltages of respective variable emphasis type gain control circuits in the above signal level compression circuit and the signal level expansion circuit, are produced by giving predetermined time constants to envelope wave detected outputs of output signals or input signals of the above variable emphasis type gain control circuits. Accordingly, since the control voltage level varies according to a level expansion characteristic corresponding to the level variation of the level compressed signal, the noise within the level compressed signal applied to the signal level expansion circuit is subjected to level modulation by the signal level expansion circuit. Therefore, noise modulation phenomenon was introduced in the output of the signal level expansion circuit.

Hence, in the above conventional noise reducing apparatus, degradation is introduced in the auditory fidelity if the level modulated noise obtained from the signal level expansion circuit is not masked by the signal level.

The above noise modulation phenomenon is closely related to the returning time of the signal level expansion circuit. Generally, when the returning time is long, the noise modulation phenomenon is easily notable and unpleasant to the ear, and on the other hand, when the recovery time is short, the noise is masked and hardly detected by the ear. Accordingly, the noise modulation phenomenon can be improved by reducing the above recovery time. However, there is a limit in reducing the above recovery time, since it is necessary to prevent the distortion factor in the level compressed and expanded signal from becoming worse due to a ripple component included within the control voltage in the lowermost signal frequency at which the signal compression and expansion is performed. Therefore, there was a disadvantage in the conventional noise reducing apparatus in that it was difficult to greatly improve the noise modulation phenomenon.

SUMMARY OF THE INVENTION

Accordingly, it is a general object of the present invention to provide a novel and useful noise reducing apparatus in which the above described problems have been overcome.

Another and more specific object of the present invention is to provide a noise reducing apparatus capable of always maintaining a most suitable time constant of a control voltage by varying the time constant of the control voltage according to change in an input signal frequency, even when the input signal frequency changes from a low frequency range to a high frequency range.

Other objects and further features of the present invention will be apparent from the following detailed description when read in conjunction with the accompanying drawings.

BRIEF DESCRIPTION OF THE DRAWINGS

FIG. 3 is a graph showing an input signal level versus output signal level characteristic of a noise reducing apparatus;

FIGS. 4(A) through 4(G) are diagrams respectively showing signal waveforms for explaining the operation of each part of the block system shown in FIG. 1;

FIG. 5 is a systematic circuit diagram showing an embodiment of a noise reducing apparatus according to the present invention;

FIG. 6 is a graph showing an example of a frequency characteristic of a variable gain control circuit shown in FIG. 5 in a non-operational state; and FIGS. 7A through 7C are graphs respectively showing characteristics of each circuit part in the circuit system shown in FIG. 5.

DETAILED DESCRIPTION

Figure 1:
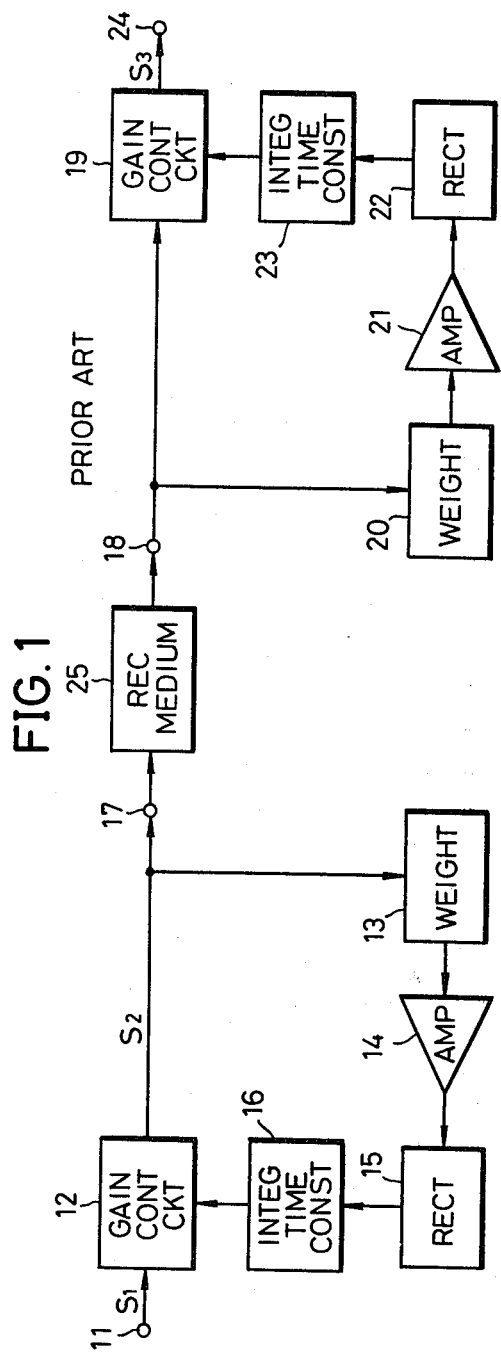
FIG. 1 is a systematic block diagram showing an example of a conventional noise reducing apparatus.

Before describing the present invention, description will first be given with respect to an example of a conventional noise reducing apparatus by referring to FIGS. 1 through 3. In FIG. 1, a circuit part existing from an input terminal 11 through an output terminal 17 is a signal level compression circuit, a circuit part exisiting from an input terminal 18 through an output terminal 24 is a signal level expansion circuit, and a transmission path existing from the output terminal 17 through the input terminal 18 is a magnetic recording medium 25, for example. An input signal S1 applied to the input terminal 11 is supplied to a variable emphasis type gain control circuit 12 wherein a predetermined emphasis characteristic is given to the signal thus supplied. The above variable emphasis type gain control circuit 12 has a characteristic indicated by A in FIG. 2, when the gain control circuit 12 is in a non-operational state, that is, when the control voltage is a constant D.C. voltage.

Figure 2:
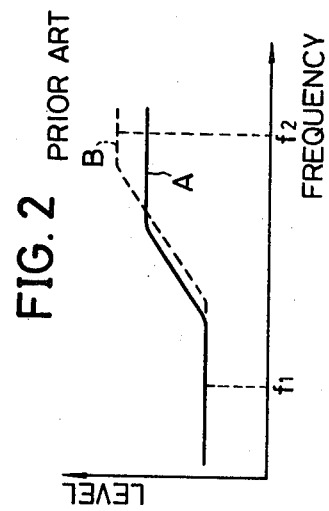
FIG. 2 is a graph showing examples of frequency characteristics of a variable gain control circuit in a non-operational state, and a weighting circuit respectively shown in FIG. 1.

An output signal of the gain control circuit 12 is supplied to the output terminal 17 on one hand, and supplied to a weighting circuit 13 on the other wherein a characteristic indicated by a dotted line B in FIG. 2 is given to the signal. An output signal of the weighting circuit 13 is amplified at an amplifier 14 with a predetermined gain, and then detected of the envelope after being rectified at a rectifying cirtcuit 15. An output signal of this rectifying circuit 15 is supplied to an integration time constant circuit 16 wherein the signal is converted into a control voltage. The output control voltage of the integration time constant circuit 16 is supplied to the above gain control circuit 12 to control the gain of the gain control circuit 12.

The above gain control circuit 12 increases the level of the input signal S1 when the level of the input signal S1 is lower than a predetermined level, and produces a level compressed signal S2 through the output terminal 17. In FIG. 3, a solid line a and a dotted line c respectively indicate input level versus output level characteristics of the signal level compression circuit. The solid line a indicates a characteristic at a frequency f2 shown in FIG. 2, while the dotted line c indicates a characteristic at a frequency f1 shown in FIG. 2. Accordingly, when the input signal S1 is of high level during a time interval between times t1 and t3 as shown in FIG. 4(A), the signal waveform of the level compressed signal S2 becomes as shown in FIG. 4(B).

The above level compressed signal S2 is recorded onto the magnetic recording medium 25 shown in FIG. 1 by a recording head (not shown) and then reproduced by a reproducing head (not shown). A reproduced output signal of the above reproducing head is a signal obtained by multiplexing noise N shown in FIG. 4(C) with the level compressed signal S2. The reproduced output signal of the reproducing head is simultaneously supplied to a variable emphasis type gain control circuit 19 and a weighting circuit 20. Moreover, the relationship between the reproduced level compressed signal S2 and the noise N is such that $S2 >> N$.

An output signal of the weighting circuit 20 is amplified at an amplifier 21 with a predetermined gain, and then supplied to a rectifying circuit 22. The signal thus supplied to the rectifying circuit 22 is rectified and detected of the envelope and then supplied to an integration time constant circuit 23. The characteristic of the integration time constant circuit 23 is selected to the same characteristic as the above integration time constant circuit 16, and the integration time constant circuit 23 variably controls the gain of the gain control circuit 19 by an output control voltage. The characteristics of the weighting circuit 20, the amplifier 21, and the rectifying circuit 22 are respectively selected to characteristics which are the same as the corresponding characteristics of the weighting circuit 13, the amplifier 14, and the rectifying circuit 15. Accordingly, the gain control circuit 19 performs a level control operation complementary to the operation of the gain control circuit 12. Hence, an output signal of the gain control circuit 19 is a signal in which noise n is multiplexed with a level expanded signal S3, and this output signal of the gain control circuit 19 is produced through the output terminal 14.

Therefore, the input signal level versus output signal level characteristic of the signal level expansion circuit becomes as indicated by the solid line b in FIG. 3 at the frequency f2, and as indicated by a dotted line d in FIG. 3 at the frequency f1. However, since a reproduced level compressed signal S2 having a characteristic indicated by lines a and c is supplied to the input terminal 18, the level expanded signal S3 produced through the output terminal 24 is restored into a signal which is exactly the same as the input signal S1 of the level compression circuit. That is, the characteristic of the noise reducing apparatus shown in FIG. 1 between the input signal level of the input terminal 11 and the output signal level of the output terminal 24 becomes as indicated by a solid line e in FIG. 3, in which the input signal level and the output signal level are the same.

In a case where the input signal S1 shown in FIG. 4 (A) is supplied to the above level expansion circuit, an output signal having a waveform shown in FIG. 4(D) is obtained from the level expansion circuit. Further, the waveform of the output control voltage of the integration time constant circuit 23 becomes as shown in FIG. 4(E). Since a multiplexed signal consisting of the level compressed signal S2 shown in FIG. 4(B) and the noise N shown in FIG. 4(C) is supplied to the level expansion circuit, the level expanded signal S3 shown in FIG. 4(F) and the noise n shown in FIG. 4(G) are respectively obtained through the output terminal 24.

Accordingly, in a case where degradation is introduced in the signal-to-noise (S/N) ratio of the level compressed signal reproduced from the magnetic recording medium 25, the noise N is also given a level expansion characteristic by the signal level expansion circuit. Hence, the noise is produced as the noise n in which the level is suppressed as shown in FIG. 4(G), and the S/N ratio is thus improved.

However, the input noise N of the above signal level expansion circuit is subjected to level modulation according to a level expansion characteristic by the control voltage supplied to the gain control circuit 19 from the integration time constant circuit 23, and introduces a noise modulation phenomenon as described above. That is, in FIGS. 4(A) through 4(G), the above noise modulation phenomenon is not a big problem with respect to the auditory sense during the time interval between the times t1 and t3, since the level of the level expanded signal S3 is high and the noise n is masked by the signal level. However, during a time interval between times t3 and t4 (referred to as a returning time), the above noise modulation phenomenon becomes notable to the ear and introduces an auditory problem since the signal level is low, the noise n is subjected to level modulation, and auditory masking is not preformed with respect to the noise n.

The present invention has overcome the above described problems, by use of a construction described in the following.

FIG. 5 is a systematic circuit diagram showing an embodiment of a noise reducing apparatus according to the present invention. A circuit part existing from an input terminal 26 through an output terminal 41 is a signal level compression circuit, and a circuit part existing from an input terminal 42 to an output terminal 57 is a signal level expansion circuit. The input signal level versus output signal level characteristics of the above signal level compression circuit and the signal level expansion circuit are the same as those indicated in FIG. 3. Moreover, a transmission path from the output terminal 41 to the input terminal 42 is a magnetic recording medium 58, for example. An incoming input signal X supplied to the input terminal 26 is supplied to a variable emphasis type gain control circuit 27 which has a frequency characteristic shown in FIG. 6 upon a non-operational state. The above signal supplied to the gain control circuit 27 is separated into three output signals, where one output signal is supplied to the output terminal 41 while the other two output signals are respectively supplied to a lowpass filter 32 and a highpass filter 33.

The above gain control circuit 27 comprises an emphasis circuit 28 supplied with the input signal X, an inverting amplifier 29 for inverting and amplifying an output signal of the emphasis circuit 28 and an output signal of a voltage controlled amplifier 30, and the voltage controlled amplifier 30 supplied with an output signal of the inverting amplifier 29. Further, the emphasis circuit 28 comprises a resistor R2 connected in series with a parallel circuit having a resistor R1 and a capacitor c. The voltage controlled amplifier 30 consists of an analog multiplier 31 for multiplying an added control voltage $E_0$ obtained from an adding circuit 40 which will be described hereinafter with an output signal of the inverting amplifier 29, and a resistor R3. The gain of the voltage controlled amplifier 30 is K/G where G varies according to the added control voltage $E_0$ and K is a coefficient of the voltage controlled amplifier 30.

The lowpass filter 32 has a frequency characteristic as indicated by a line I in FIG. 7A, and the highpass filter 33 has a frequency characteristic as indicated by a line II in FIG. 7A. An output signal of the lowpass filter 32 is supplied to an amplifier 34 whose gain is preset to $A_L$, and then supplied to a rectifying circuit 36 wherein the signal is rectified and the envelope is detected. An output signal of the above rectifying circuit 36 is supplied to an integration time constant circuit 38 and converted into a control voltage $EC_L$ indicated in FIG. 7B. On the other hand, an output signal of the highpass filter 33 is supplied to a rectifying circuit 37 through an amplifier 35 whose gain is preset to $A_H$, to be rectified and detected of the envelope. An output signal of the rectifying circuit 37 is supplied to an integration time constant circuit 39 and converted into a control voltage $EC_H$ indicated in FIG. 7B.

When the frequency of the input signal X is f1 as indicated in FIG. 6, frequency selection is performed by the lowpass filter 32, and the control voltage $EC_L$ is obtained as output from the integration time constant circuit 38. On the other hand, when the frequency of the input signal X is f3 as indicated in FIG. 6, frequency selection is performed by the highpass filter 33, and the control voltage $EC_H$ is obtained as output from the integration time constant circuit 39. Furthermore, when the frequency of the input signal X is an intermediate frequency between the frequencies f1 and f3, mainly f2, frequency selection is performed by both the lowpass filter 32 and the highpass filter 33. Accordingly, in this case, the control voltages $EC_L$ and $EC_H$ are respectively obtained as outputs from the integration time constant circuits 38 and 39.

The above control voltages $EC_L$ and $EC_H$ are respectively supplied to the adding circuit 40 provided at a following stage, wherein the voltages are added to form the added control voltage $E_0$. This added control voltage $E_0$ is applied to one input terminal of the analog multiplier 31 within the gain control circuit 27. Accordingly, the gain of the gain control circuit 27 is variably controlled to perform a signal level compression on the input signal X. Hence, the level compressed signal Y is produced through the output terminal 41.

That is, in the signal level compression circuit formed between the input terminal 26 through the output terminal 41, a transfer function $H_c(s)$ of the gain control circuit 27 in a non-operational state can be described by a following equation (1), where $s = j\omega$ and F(s) is a transfer function of the emphasis circuit 28 expressed by equation (2).

$$H_c(s) = \frac{Y}{X} = \frac{K}{F(s) \cdot G} \quad (1)$$

$$F(s) = \frac{R2(1 + sCR1)}{R1 + R2(1 + sCR1)} \quad (2)$$

Hence, the level compression characteristic indicated by a and c in FIG. 3 are given by the level compression circuit having the above transfer function $H_c(s)$. Moreover, the gain of the inverting amplifier 29 is set to infinity.

In the present embodiment of the invention, the integration time constant circuit 38 is a circuit which produces the control voltage $EC_L$ from a signal obtained by amplifying the output signal of the lowpass filter 32 by the gain $A_L$ at the amplifier 34. Thus, the time constant of the integration time constant circuit 38 is set to a relatively large time constant TC1. On the other hand, the integration time constant circuit 39 is a circuit which produces the control voltage $EC_H$ from a signal obtained by amplifying the output signal of the highpass filter 33 by the gain $A_H$ at the amplifier 35. Therefore, the time constant of the integration time constant circuit 39 is set to a relatively small time constant TC3. These time constants TC1 and TC3 are set to time values which are short and reduced as much as possible without introducing problems due to worsening of the distortion caused by ripple in the control voltages $EC_L$ and $EC_H$. Accordingly, a time constant $E_C$ of the added control voltage $E_0$ is equal to the relatively large time constant TC1 when the frequency of the input signal X is f1 as indicated in FIG. 7C. Further, the time constant $E_C$ of the added control voltage $E_0$ is equal to the relatively small time constant TC3 or a time constant TC2 having an intermediate value between the time constants TC1 and TC3, when the frequency of the input signal X is f3 or f2 as indicated in FIG. 7C. For example, the above time constants TC1, TC2, and TC3 are approximately equal to 200 milli-seconds, 80 milli-seconds, and 30 milli-seconds, respectively. In addition, the above frequencies f1, f2, and f3 are respectively equal to approximately 100 HZ, 2 kHz, and 10 kHz, for example.

Accordingly, the time constant of the added control voltage $E_0$ varies according to the change in the frequency of the input signal X, and the most suitable time constant can always be maintained for each frequency of the input signal X. In the conventional noise reducing apparatus, no problems were introduced upon controlling of a signal frequency in the low frequency range, since the integration time constant was selected within a range in which distortion is not introduced due to ripple, in a lowermost frequency range of the signal which is subjected to the signal level compression and expansion. However, the time constant was too large for controlling the signal frequency in the high frequency range. Therefore, in the conventional noise reducing apparatus, when a signal having a frequency which is in an exessively high frequency range is applied, the noise modulation phenomenon became a problem since the recovery time of the control voltage obtained is slow. However, in the noise reducing apparatus according to the present invention, the noise modulation phenomenon can be greatly reduced since distortion due to ripple is no longer a problem.

The level compressed signal Y obtained through the output terminal 41 is recorded onto the magnetic recording medium 58 by a recording head (not shown), and then reproduced in a state accompanying noise by a reproducing head (not shown). The reproduced signal obtained from the reproducing head is supplied to a variable emphasis type gain control circuit 43, a lowpass filter 48, and a highpass filter 49, respectively, through the input terminal 42.

The characteristics of the lowpass filter 48, the highpass filter 49, amplifiers 50 and 51, rectifying circuits 52 and 53, integration time constant circuits 54 and 55, and an adding circuit 56 within the level expansion circuit respectively have the same characteristics as the lowpass filter 32, the highpass filter 33, the amplifiers 34 and 35, the rectifying circuits 36 and 37, the integration time constant circuits 38 and 39, and the adding circuit 40.

An output signal of the lowpass filter 48 is supplied to the adding circuit 56 through the amplifier 50, the rectifying circuit 52, and the integration time constant circuit 54. On the other hand, an output signal of the highpass filter 49 is supplied to the adding circuit 56 through the amplifier 51, the rectifying circuit 53, and the integration time constant circuit 55. An added control voltage obtained from the adding circuit 56 is applied to one input terminal of an analog multiplier 45 within the variable emphasis type gain control circuit 43. The circuit for producing the above added control voltage performs the same operation as that performed by the added control voltage producing circuit within the signal level compression circuit described above.

The above gain control circuit 43 comprises a voltage controlled amplifier 44, an inverting amplifier 46, and an emphasis circuit 47. The voltage controlled amplifier 44 consists of the analog multiplier 45 and the resistor R3. Furthermore, the emphasis circuit 47 is of a construction similar to that of the emphasis circuit 28, having the resistors R1 and R2 and the capacitor C. Accordingly, the transfer function of the above emphasis circuit 47 can be described by the transfer function F(s) of the emphasis circuit 28 described by the equation (2). In addition, the gain of the voltage controlled amplifier 44 can be described by the same expression K/G which is the gain of the voltage controlled amplifier 30. Therefore, a transfer function $H_z(s)$ of the gain control circuit 43 can be described by a following equation (3) in a non-operational state, when the level expanded signal supplied to the output terminal 57 is designated by Z, where the gain of the inverting amplifier 46 is assumed to be infinity.

$$H_e(s) = \frac{Z}{Y} = \frac{F(s) \cdot G}{K} \quad (3)$$

As clearly observed from the above equation (3), the variable emphasis type gain control circuit 43 has a transfer function which is complementary to the transfer function of the above described variable emphasis type gain control circuit 27. Hence, the gain control circuit 43 produces and supplies the signal Z to the output terminal 57 which has the same signal level as the input signal X to the input terminal 26, that is, so that a relationship X=Z stands between the equations (1) and (3). Moreover, the S/N ratio of the output signal Z is improved compared to that of the input signal Y, and the noise modulation phenomenon is greatly improved as described above.

In the above embodiment of the invention, description was given for a case where the magnetic recording medium is used as the transmission path. However, the present invention can also be applied for cases where a record disc or a broadcasting signal transmission paths is used as the above transmission path.

Further, the present invention is not limited to these embodiments, but various variations and modifications may be made without departing from the scope of the present invention.

What is claimed is:

1. A noise reducing apparatus comprising:
a single first variable gain control circuit means for giving a level compression characteristic to an input signal in response to a single first composite control voltage, to produce an output signal to a transmission path;
first control voltage producing circuit means for dividing an output signal of said first variable gain control circuit means into a plurality of frequency bands, and for producing a plurality of control voltages respectively given with mutually different integration time constants for each of the divided frequency bands;
first adding circuit means for respectively additively composing said plurality of control voltages obtained from said first control voltage producing circuit means, to obtain said single first composite control voltage;
single second variable gain control circuit means responsive to a single second composite control voltage for giving a level expansion characteristic complementary to said level compression characteristic to a level compressed signal received through said transmission path to produce an output signal;
second control voltage producing circuit means for dividing an input signal of said second variable gain control circuit into a plurality of frequency bands, and for producing a plurality of control voltages respectively given with mutually different integration time constants for each of the divided frequency bands; and
second adding circuit means for respectively additively composing said plurality of control voltages obtained from said second control voltage producing circuit, to obtain said single second composite control voltage.

2. A noise reducing apparatus as claimed in claim 1 in which said time constants given to said plurality of control voltages in said first and second control voltage producing circuit means are set to minimum values within a range in which a worsening of distortion due to ripple in the control voltages in said divided frequency bands do not introduce problems.

3. A noise reducing apparatus as claimed in claim 1 in which said first and second variable gain control circuit means have mutually complementary emphasis characteristics when said first and second composite control voltages are constant values having a particular relationship with respect to each other.

4. A noise reducing apparatus as claimed in claim 1 in which said first variable gain control circuit means comprises a first emphasis circuit means supplied with said input signal, a first inverting amplifier at an output stage of said first emphasis circuit, and a first voltage controlled amplifier supplied with a level compressed signal produced from said first inverting amplifier and said first composite control voltage, to supply an output signal to said first inverting amplifier.

5. A noise reducing apparatus as claimed in claim 4 in which said first voltage controlled amplifier comprises a first analog multiplier for multiplying the level compressed signal produced from said first inverting amplifier with said first composite control voltage, and a first resistor connected between an output end of said first analog multiplier and an input end of said first inverting amplifier.

6. A noise reducing apparatus as claimed in claim 1 in which said second variable gain control circuit means comprises a second voltage controlled amplifier supplied with said level compressed signal received through said transmission path and said second composite control voltage, a second inverting amplifier at an output stage of said second voltage controlled amplifier, and a second emphasis circuit in a feedback path of said second inverting amplifier.

7. A noise reducing apparatus as claimed in claim 6 in which said second voltage controlled amplifier comprises a second analog multiplier for multiplying the level compressed signal obtained through said transmission path and said second composite control voltage, and a second resistor connected between an output end of said second analog multiplier and an input end of said second inverting amplifier.

* * * * *